(12) United States Patent
Feldman et al.

(10) Patent No.: US 8,164,936 B2
(45) Date of Patent: Apr. 24, 2012

(54) SWITCHED MEMORY DEVICES

(75) Inventors: Timothy Richard Feldman, Louisville, CO (US); Wayne Howard Vinson, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 343 days.

(21) Appl. No.: 12/578,940

(22) Filed: Oct. 14, 2009

(65) Prior Publication Data

US 2011/0085367 A1    Apr. 14, 2011

(51) Int. Cl.
*G11C 5/06* (2006.01)

(52) U.S. Cl. ............... 365/63; 365/189.04; 365/189.08; 365/189.02

(58) Field of Classification Search ............ 365/63, 365/189.02, 189.04, 189.08
See application file for complete search history.

(56) References Cited

U.S. PATENT DOCUMENTS

| | | | | |
|---|---|---|---|---|
| 716,540 | A * | 12/1902 | Hewlett | 361/82 |
| 4,471,429 | A * | 9/1984 | Porter et al. | 711/144 |
| 5,487,035 | A * | 1/1996 | Nishimura et al. | 365/189.02 |
| 6,418,068 | B1 * | 7/2002 | Raynham | 365/200 |
| 6,446,228 | B1 * | 9/2002 | Kobayashi | 714/724 |
| 6,754,769 | B2 * | 6/2004 | Kawano | 711/114 |
| 6,799,252 | B1 * | 9/2004 | Bauman | 711/149 |
| 6,813,655 | B2 * | 11/2004 | Hosoya et al. | 710/36 |
| 6,839,788 | B2 * | 1/2005 | Pecone | 710/305 |
| 6,871,253 | B2 * | 3/2005 | Greeff et al. | 710/316 |
| 6,915,389 | B2 * | 7/2005 | Fujimoto | 711/148 |
| 7,057,981 | B2 * | 6/2006 | Kano et al. | 369/30.28 |
| 7,079,525 | B1 * | 7/2006 | Goldstein et al. | 370/352 |
| 7,191,264 | B2 * | 3/2007 | Hosoya et al. | 710/74 |
| 7,263,476 | B1 * | 8/2007 | Dellacona | 703/13 |
| 7,415,565 | B2 * | 8/2008 | Bullen et al. | 710/316 |
| 7,418,533 | B2 * | 8/2008 | Ohara et al. | 710/62 |
| 7,418,549 | B2 * | 8/2008 | Abe | 711/114 |
| 7,620,858 | B2 * | 11/2009 | Kushnick | 714/716 |
| 7,769,942 | B2 * | 8/2010 | Ware et al. | 710/317 |
| 2008/0140883 | A1 | 6/2008 | Salessi et al. | |
| 2008/0140919 | A1 | 6/2008 | Torabi et al. | |
| 2008/0140945 | A1 | 6/2008 | Salessi et al. | |
| 2009/0024791 | A1 | 1/2009 | Lee et al. | |
| 2009/0037652 | A1 | 2/2009 | Yu et al. | |
| 2009/0077299 | A1 | 3/2009 | Wang et al. | |

\* cited by examiner

*Primary Examiner* — Viet Q Nguyen
(74) *Attorney, Agent, or Firm* — Leanne Taveggia Farrell; Westman, Champlin & Kelly, P.A.

(57) ABSTRACT

A data storage system includes a plurality of memory devices for storing data. The plurality of memory devices is classified into a plurality of groups of memory devices. A control circuit is adapted to provide concurrent memory access operations to the plurality of memory devices. Each of a plurality of data channels is configured to provide a data path between the control circuit and one of the groups of memory devices. A plurality of switches is configured to connect and disconnect one of the memory devices in a select one of the groups of memory devices to one of the plurality of data channels and concurrently connect and disconnect another of the memory devices in the select group of memory devices to a different one of the plurality of data channels.

20 Claims, 5 Drawing Sheets

SWITCHED MEMORY DEVICES

BACKGROUND

A data storage system is an example of a system having at least one memory device that at least one medium for data storage. The data storage system can include one or more types of storage mediums such as, but not limited to, hard discs, floppy discs, magnetic discs, optical discs, magnetic tapes, solid-state storage components, and/or combinations thereof. For instance, an exemplary data storage system can comprise a hard disc drive (HDD), a solid-state drive (SDD), a "hybrid" drive (e.g., a hybrid hard drive (HHD) having both hard disc media and solid state media) and etc.

A data storage system includes a controller that is configured to receive data, process commands from a host and implement data operations to the storage media in the data storage system based on the commands. The data storage system can include a plurality of memory devices accessible by the controller. For example, a solid-state drive (SDD) can include a plurality of memory devices, such as a plurality of flash memory chips that is configured into a flash array.

The discussion above is merely provided for general background information and is not intended to be used as an aid in determining the scope of the claimed subject matter.

SUMMARY

A data storage system includes a plurality of memory devices for storing data and is equipped to perform at least two concurrent memory accessing operations. In one embodiment, the plurality of memory devices include at least a first group of memory devices and a second group of memory devices. The data storage system also includes a plurality of data channels configured to provide a data path between a control circuit and one of the groups of memory devices. For example, a first data channel can provide a data path for the first group of memory devices and a second data channel can provide a data path for the second group of memory devices. The control circuit is adapted to provide concurrent memory access operations to the plurality of memory devices via the plurality of data channels. For example, control circuit can provide a first memory access operation and a second memory access operation. In one embodiment, each group of memory devices includes a corresponding data channel.

A plurality of switches is configured to connect and disconnect one of the memory devices in one of the groups of memory devices to one of the plurality of data channels and concurrently connect and disconnect another of the memory devices in the select group of memory devices to a different one of the plurality of data channels. For example, a first switch can selectively pass the first memory access operation to a selected memory device in the first group of memory devices and a second switch can selectively pass the second memory access operation to a different selected memory device in the first group of memory devices.

Other features and benefits that characterize embodiments of the present invention will be apparent upon reading the following detailed description and review of the associated drawings.

DETAILED DESCRIPTION

Embodiments of the disclosure allow for the concurrent access of memory devices by providing a means to selectively couple a particular memory device to more than one data channel using a plurality of switches. Therefore, each data channel can provide a data path to any of a plurality of memory devices in a data storage system regardless of whether the data channel is normally connected to only a select group of memory devices.

Figure 1:
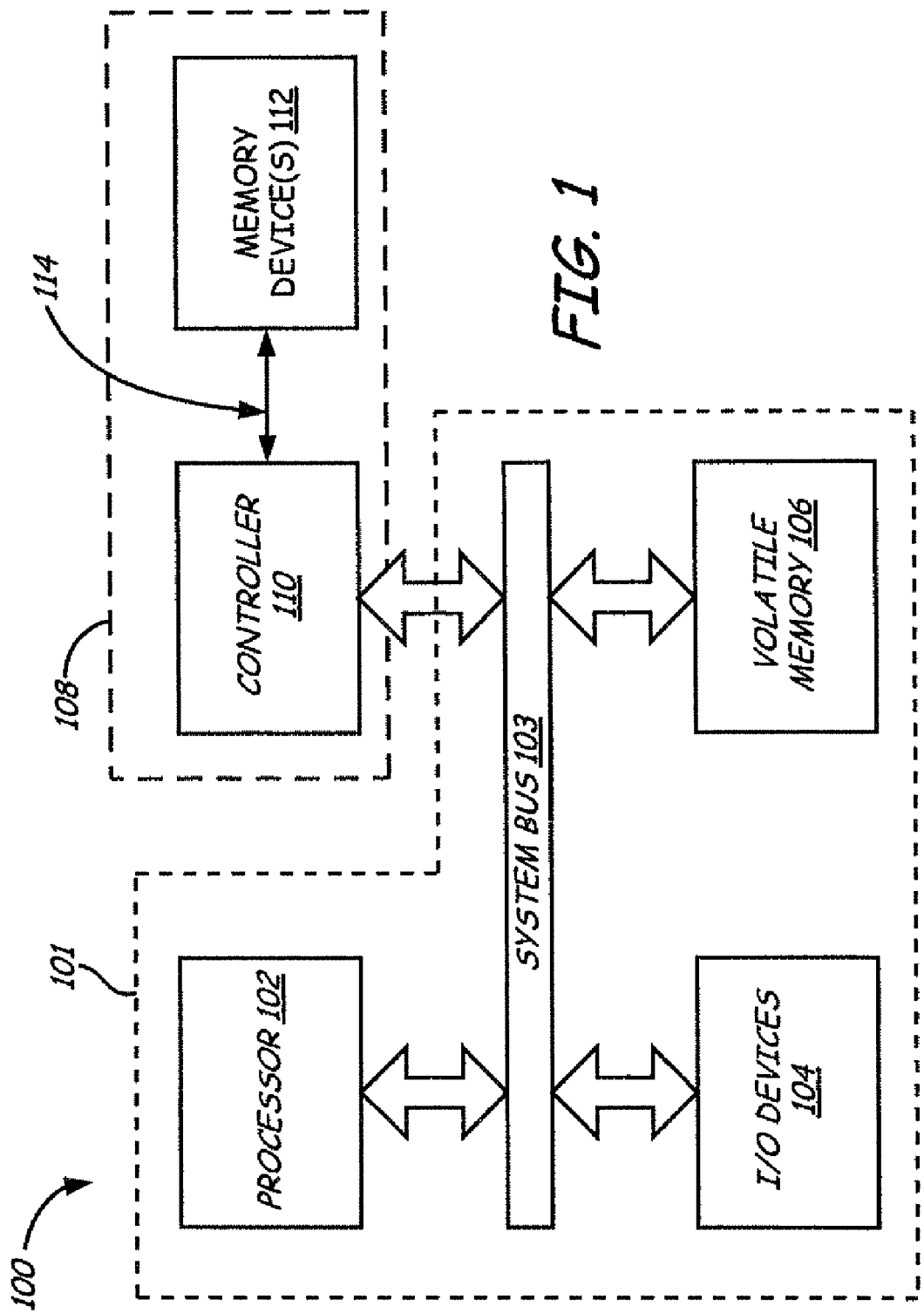
FIG. 1 illustrates a simplified block diagram of an exemplary computing system under one embodiment.

FIG. 1 illustrates a simplified block diagram of an exemplary computing system 100 under one embodiment. System 100 includes a host system 101 and a data storage system 108. Host system 101 includes a processor 102 connected to a system bus 103 which can also be connected to input/output (I/O) devices 104, such as a keyboard, monitor, modem, storage device, or pointing device. System bus 103 is coupled to a memory 106, which may be a random access volatile memory, such as dynamic random access memory (DRAM).

Data storage system 108 includes a controller 110, which is coupled to processor 102 via a connection through the system bus 103. It is noted that in some systems this connection is made through one or more intermediary devices, such as a host bus adapter or a bridge. Data storage system 108 also includes memory device(s) 112. Although only one data channel 114 is illustrated in the FIG. 1 embodiment, controller 110 communicates with memory device(s) 112 over one or more channels (i.e., buses) 114.

In one embodiment, data storage system 108 is a non-volatile flash memory device or solid state memory device where controller 110 is coupled to memory device(s) 112 that, in one embodiment, can be flash array(s). Flash arrays 112 can include one or more integrated circuit memory chips or memory devices. In other embodiments, data storage system 108 can also include volatile and/or non-solid-state memory. For example, data storage system 108 can comprise a disc drive and/or a "hybrid" drive including solid-state components and hard disc components. It should be realized that other types of data storage systems are possible.

During operation, processor 102 sends commands and data to data storage system 108 to retrieve or store data. Controller 110 receives the commands and data from processor 102 and determines when, where and how to store or retrieve data from memory device(s) 112 in accordance with the commands issued by processor 102.

A disc drive, which is one example type of storage device, uses dedicated point-to-point connections in its internal design. With the exception of dual host port implementations of Serial Attached SCSI (SAS) and Fibre Channel, a disc drive is designed to connect only single nodes. Disc drives, in general have employed tree topologies in which a single host or initiator is connected to multiple disc drives or targets. This includes Parallel Advanced Technology Attachment (PATA) with its master-slave concept and multiple drop parallel Small Computer System Interface (SCSI) allowing multiple devices to be connected to a single data bus. Solid state drives internally have multiple flash or memory devices that are configured in a tree topology where one controller is connected to multiple channels, and each channel has its own captive bus of flash or memory devices.

Faster data storage and retrieval from flash or other memory devices in solid state drives may be achieved through hardware parallelism and increasing operation concurrency. As solid state drives become more sophisticated, the nodes through which data flows can include not only the flash or memory device and the control-to-flash channels, but multiple host ports and multiple compression engines. Connecting all of these through a tree structure limits the ability to fully utilize the parallelism when one node in the tree is in use or reserved. When a node is in use or reserved, other operations that need to access the media on that branch of the tree are stalled until the node again becomes available. This is a resource collision problem that can be exacerbated by the fixed or static connectivity of tree topology.

Figure 2:
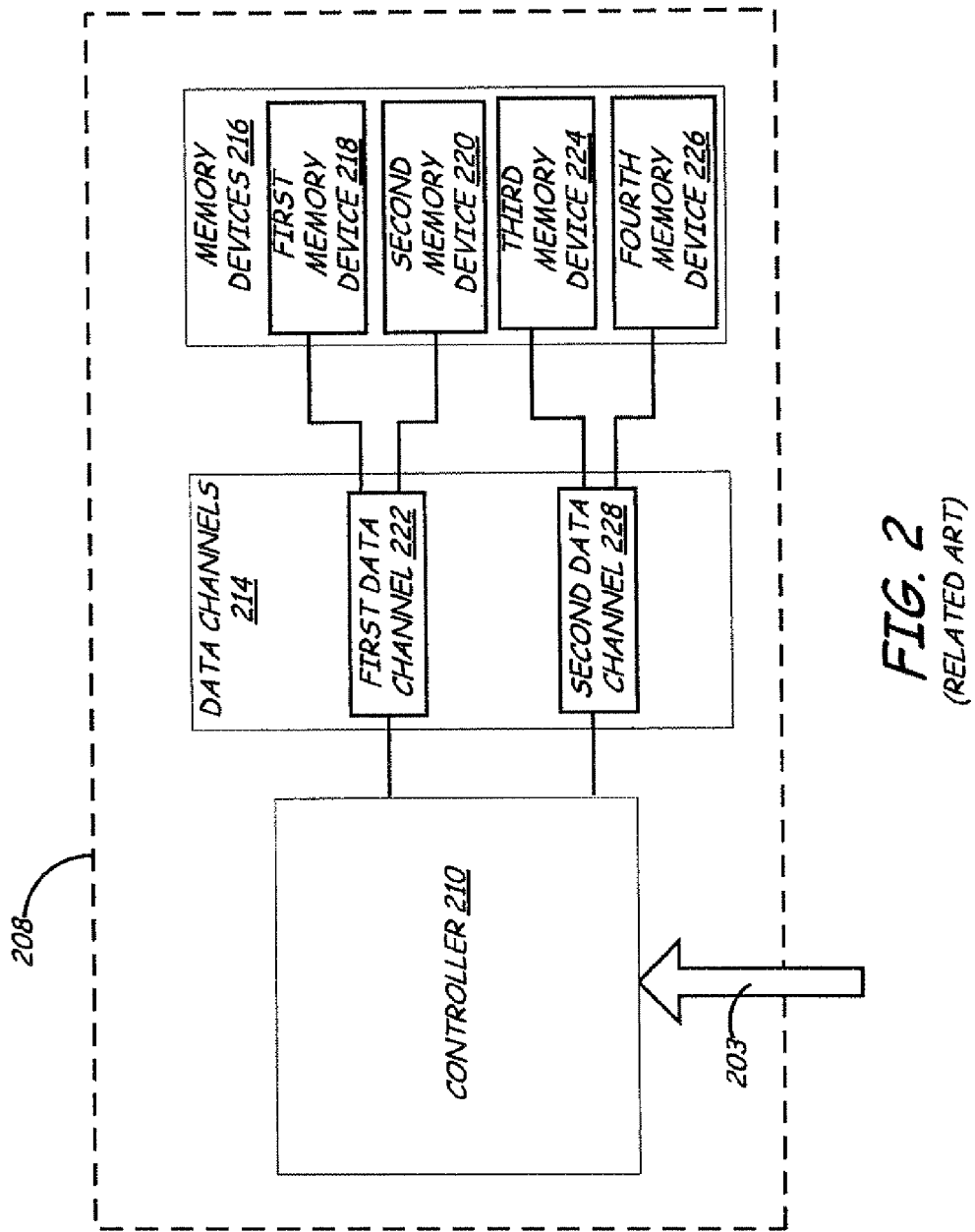
FIG. 2 illustrates a simplified block diagram of a related art data storage system.

For example, FIG. 2 illustrates a simplified block diagram of a related art data storage system 208. Data storage system 208 includes a controller 210, a plurality of data channels 214 and a plurality of flash or memory devices 216. In the illustrated configuration, it is possible that if two queued read commands are received by controller 210 from a host or processor that require that data be accessed from two different memory devices via a system bus 203, these operations can take place in parallel or simultaneously using first data channel 322 and second data channel 328. However, if the read commands require data from two memory devices that share the same branch on the illustrated tree topology, then the read operations must take place serially. In FIG. 2, for example, if a first read command requires data from first memory device 218 and a second read command requires data from second memory device 220, both commands must use first data channel 222 causing a resource collision problem. Therefore, the read operations can only be processed serially.

Figure 3:
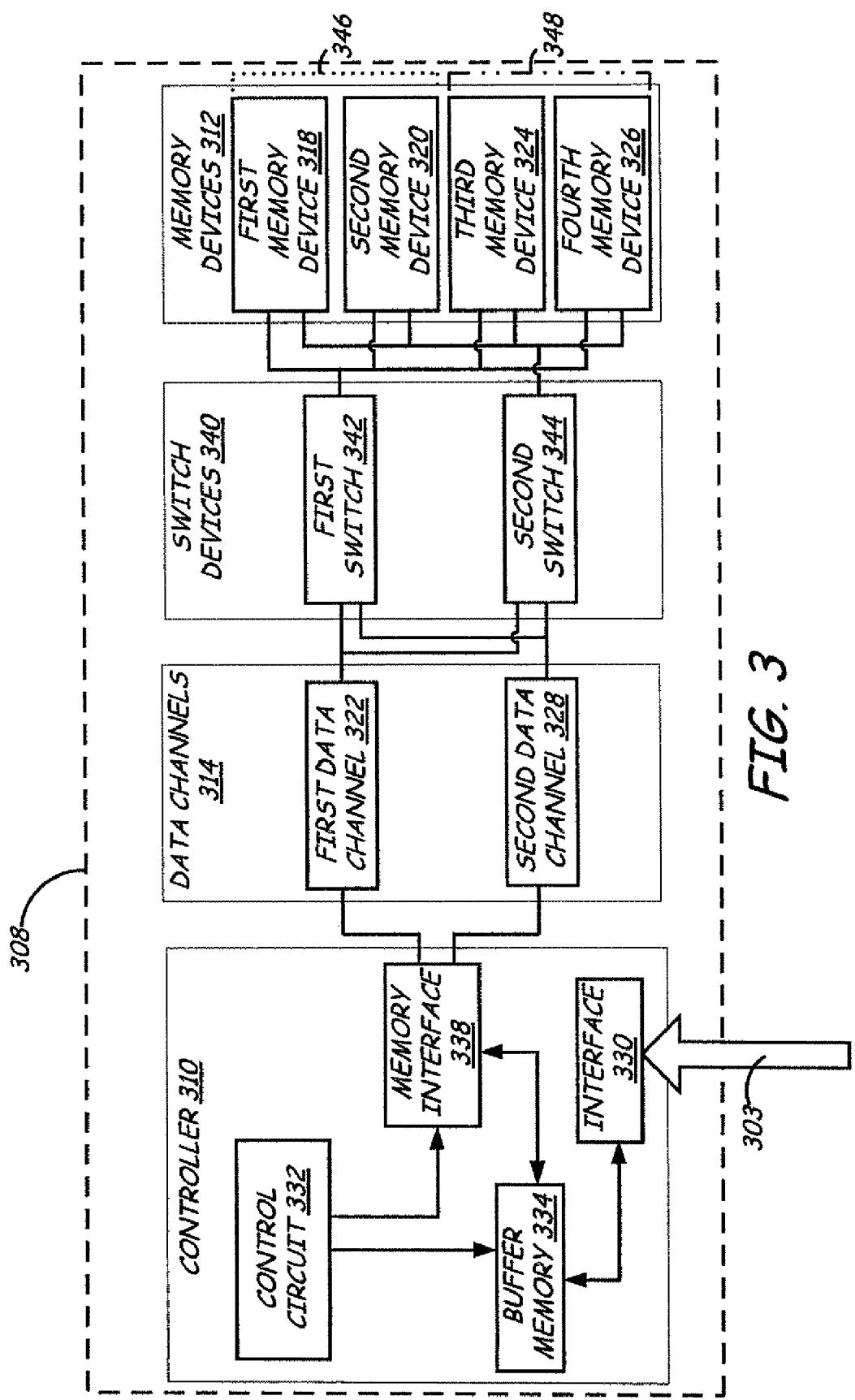
FIG. 3 illustrates a simplified block diagram of a data storage system under one embodiment.

Under one embodiment of the disclosure, FIG. 3 illustrates a block diagram of a data storage system 308. Data storage system 308 includes a controller 310 coupled to a plurality of memory devices 312 via data channels 314. Data channels 314 provide a data path between controller 310 and memory devices 312. In particular, controller 302 is coupled to each memory device 312 via corresponding first data channel 322 and coupled to each memory device 312 via corresponding second channel 328. It is a plurality of switch devices 340 that allow first data channel 322 to couple to each memory device 312 and allow second data channel 324 to couple to each memory device 312. It should be realized that data storage system 308 can include any number of memory devices and can include any number of data channels.

Controller 302 is coupled to system bus 303 via an interface 330 that can receive and send commands and data to a host, such as processor 102 in FIG. 1. Interface 330 can pass the command to control circuit 332 for processing and also store the received data in a buffer memory 334. Control circuit 332 can process commands and communicate commands to a memory interface 338

Memory interface 338 can receive data from buffer memory 334 to be written to one of the memory devices 312 in accordance with address bits received from control circuit 332. Memory interface 338 can assert corresponding data and address bits with appropriate timing and format to a selected memory device. Memory interface 338 can also read previously stored data from any selected logical unit of data from any of memory devices 312.

As described above in connection with FIG. 2, normally first data channel 322 is coupled (via a tree topology) to a first group 346 of memory devices including first and second memory devices 318 and 320 and second data channel 328 is coupled (via a tree topology) to a second group 348 of memory devices including third and fourth memory devices 324 and 326. Switch devices 340 are included to dynamically establish point-to-point connections to allow for any of data channels 314 to be dynamically connected with any of memory devices 312. Switch devices 340 are capable of making connections as needed and releasing connections when no longer needed so as to allow for previously connected nodes to be connected in a new and different way. In other words, each of the plurality of switches 340 can dynamically connect and disconnect with any one of the plurality of memory devices 312 to any one of the plurality of data channels 314 to such that a particular memory device can be accessed by any of the data channels 314.

More specifically, first switch device 342 can be dynamically coupled to any of first data channel 322 and second data channel 328 and dynamically coupled to any of first memory device 318, second memory device 320, third memory device 324 and fourth memory device 326. Likewise, second switch device 344 can be dynamically coupled to any of first data channel 322 and second data channel 328 and dynamically coupled to any of first memory device 318, second memory device 320, third memory device 324 and fourth memory device 326. However, it should be realized that in other embodiments, first data channel 322 can only be coupled to first switch 342 and second data channel 324 can only be coupled to second switch 344.

Switch device 340 provides data storage system 308 with the ability to concurrently process a first memory access operation and a second memory access operation that requires access of memory devices that can normally only be accessed using a single data channel. For example, control circuit 332 can concurrently transmit a first memory operation that requires data from first memory device 318 and a second memory operation that requires data from second memory device 320. Normally such operations could not be processed concurrently because they would both require use of first data channel 322. However, switch devices 340 provide for the concurrent access of first and second memory devices 318 and 320. The first memory operation can be transmitted over first data channel 322 and first switch 342, which dynamically couples to first memory device 318 for access. The second memory operation can be transmitted over second data channel 328 and second switch 344, which dynamically couples to second memory device 320 for access. Therefore, concurrent connections can be established at any time between controller 310 and memory device if one channel and one switch are available.

Not only can switch devices 340 be used to allow for the concurrent access of memory devices 312 that are in the same group of memory devices, but switch devices 340 can also be used to allow for the concurrent access of select memory devices that are in different memory device groups. An example of the former situation and as discussed above, first switch 342 can allow for access to first memory device 318 in the first group of memory devices 346 and second switch 344 can allow for access to second memory device 320 in the first group of memory devices 346. An example of the latter situation, it is also possible that first switch 342 can allow for access to one of first and second memory devices 318 and 320 of the first group of memory devices 346 while second switch 344 can allow for access to one of third or fourth memory devices 324 and 326.

Figure 4:
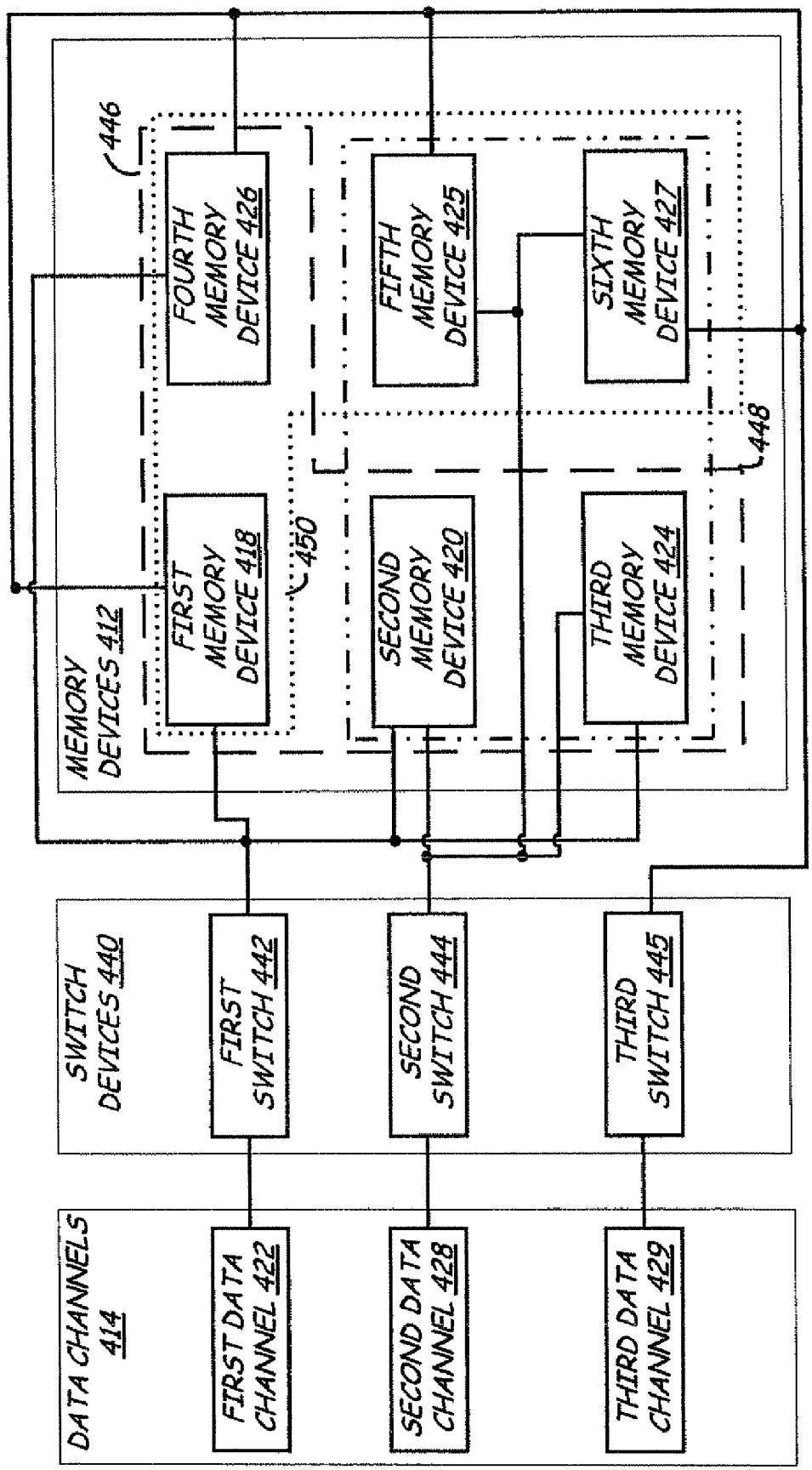
FIG. 4 illustrates a simplified block diagram of select components of a data storage system under another embodiment.

Under another embodiment of the disclosure, FIG. 4 illustrates a block diagram of select components of a data storage system. Specifically, FIG. 4 illustrates a plurality of data channels 414, a plurality of switches 440 and a plurality of memory devices 412 of a data storage system. It should be realized that a data storage system can have any number of memory devices and any number of data channels. Data channels 414 provide a data path between a controller (not shown in FIG. 4) and memory devices 412. In particular, the controller is coupled to each memory device 412 via first data channel 422, second data channel 428 or third data channel 429. Unlike the embodiment illustrated in FIG. 3, FIG. 4 illustrates how each memory device 412 can be accessed by at least two data channels 414. It is a plurality of switch devices 440 that allow each memory device 412 to couple to at least two data channels 414.

First switch device 440 can dynamically establish point-to-point connections to allow first data channel 422 to be dynamically connected with any of a first group of memory devices 446 including first memory device 418, second memory device 420, third memory device 424 and fourth memory device 426. Second switch device 444 can dynamically establish point-to-point connections to allow second data channel 428 to be dynamically connected with any of a second group of memory devices 448 including second memory device 420, third memory device 424, fifth memory device 425 and sixth memory device 427. Third switch device 445 can dynamically establish point-to-point connections to allow third data channel 429 to be dynamically connected with any of a third group of memory devices 450 including first memory device 418, fourth memory device 426, fifth memory device 425 and sixth memory device 427.

Each switch device 440 is capable of making connections as needed within the group of devices that it can connect with and releasing connections when no longer needed so as to allow for previously connected nodes to be connected in a new and different way within each group. As discussed above, each memory device 412 is accessible by at least two data channels 440. For example, first memory device 418 is both of first group 446 and third group 450 and therefore can be connected to first data channel 422 or third data channel 429. Second memory device 420 is both of first group 446 and second group 448 and therefore can be connected to first data channel 422 or second data channel 428. Third memory device 424 is both of first group 446 and second group 448 and therefore can be connected to first data channel 422 or second data channel 428. Fourth memory device 426 is both of first group 446 and third group 450 and therefore can be connected to first data channel 422 or third data channel 429. Fifth memory device 425 is both of second group 448 and third group 450 and therefore can be connected to second data channel 428 or third data channel 429. Sixth memory device 427 is both of second group 448 and third group 450 and therefore can be connected to second data channel 428 or third data channel 429.

Switch devices 440 can be used to allow for the concurrent access of at least two memory devices 412 that are in the same memory device group. For example, first switch 442 can allow for access to first memory device 418 in the first group of memory devices 446 and second switch 444 can allow for access to second memory device 420 which is also in the first group of memory devices 346. Such is the case because each memory device in first group 446 overlap with some of the memory devices in either the second group 448 or the third group 450. In other words, each memory device belongs to two different groups. This configuration allows for each data channel 414 to access two or more memory devices and each memory device 412 can be accessed by two or more data channels 414.

Figure 5:
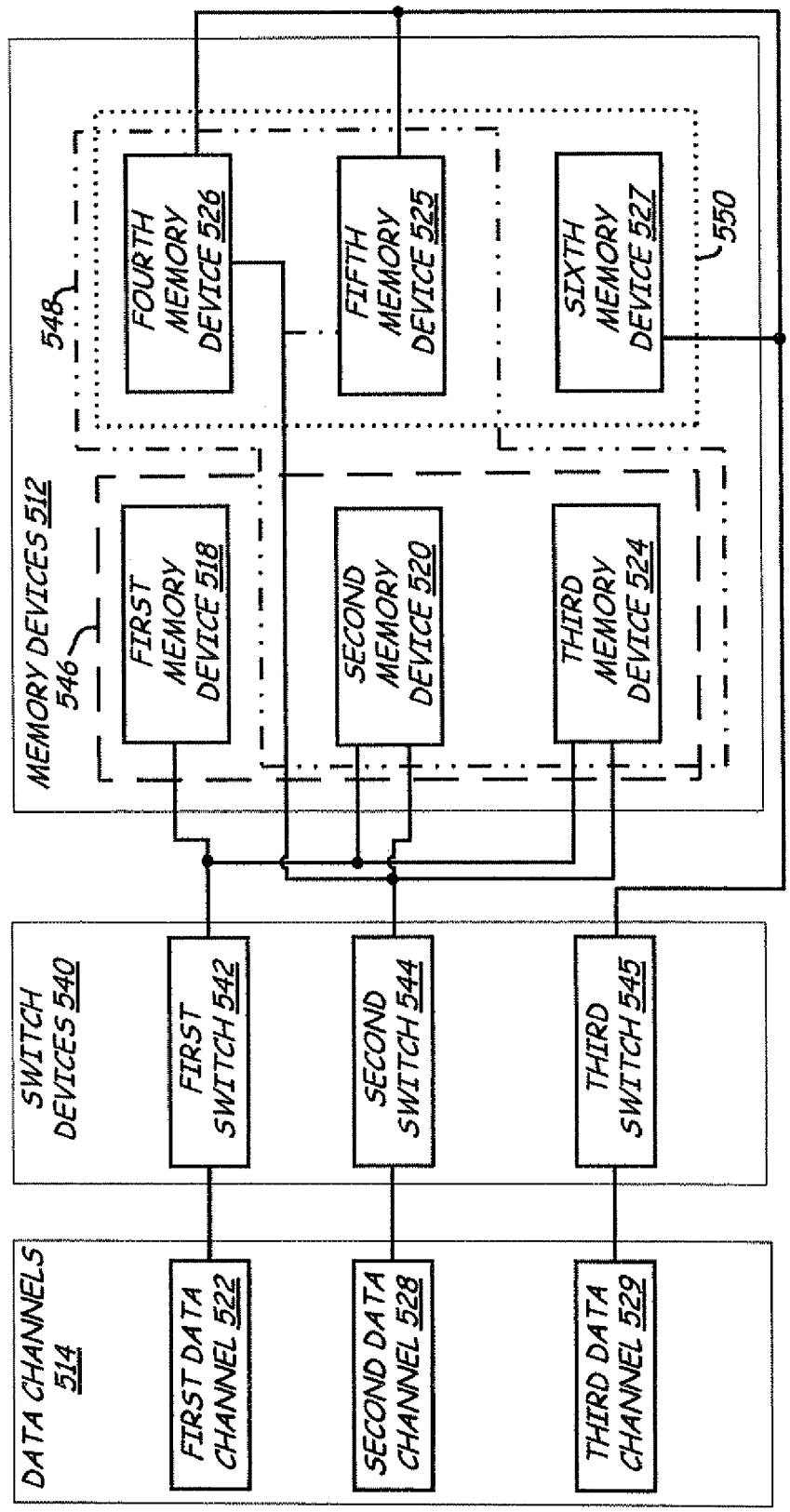
FIG. 5 illustrates a simplified block diagram of select components of a data storage system under yet another embodiment.

Under another embodiment of the disclosure, FIG. 5 illustrates a block diagram of select components of a data storage system. Specifically, FIG. 5 illustrates a plurality of data channels 514, a plurality of switches 540 and a plurality of memory devices 512 of a data storage system. It should be realized that a data storage system can have any number of memory devices and any number of data channels. Data channels 514 provide a data path between a controller (not shown in FIG. 5) and memory devices 512. In particular, the controller is coupled to each memory device 512 via first data channel 522, second data channel 528 or third data channel 529. Unlike the embodiment illustrated in FIG. 3 or 4, FIG. 5 illustrates how some or a portion of memory devices 512 can be accessed by at least two data channels 514. It is a plurality of switch devices 540 that allow some or portion of memory devices 512 to couple to at least two data channels 514.

First switch device 542 can dynamically establish point-to-point connections to allow first data channel 522 to be dynamically connected with any of a first group of memory devices 546 including first memory device 418, second memory device 520 and third memory device 524. Second switch device 544 can dynamically establish point-to-point connections to allow second data channel 528 to be dynamically connected with any of a second group of memory devices 548 including second memory device 420, third memory device 424, fourth memory device 526 and fifth memory device 525. Third switch device 445 can dynamically establish point-to-point connections to allow third data channel 529 to be dynamically connected with any of a third group of memory devices 550 including fourth memory device 526, fifth memory device 525 and sixth memory device 527.

Each switch device 540 is capable of making connections as needed within the group of devices that it can connect with and releasing connections when no longer needed so as to allow for previously connected nodes to be connected in a new and different way within each group. As discussed above, at least some or a portion of memory devices 512 are accessible by at least two data channels 440. For example, second memory device 520 is both of first group 546 and second group 548 and therefore can be connected to first data channel 522 or second data channel 528. Third memory device 524 is both of first group 546 and second group 548 and therefore can be connected to first data channel 522 or second data channel 528. Fourth memory device 526 is both of second group 548 and third group 550 and therefore can be connected to second data channel 528 or third data channel 529. Fifth memory device 525 is both of second group 548 and third group 550 and therefore can be connected to second data channel 528 or third data channel 529. First memory device 518 and sixth memory device 527 are those devices that are not accessible by two data channels 540. Instead, devices 518 and 527 are only connected to a single data channel.

Even though device 518 and 527 are only connected to a single data channel, switch devices 540 can still be used to allow for the concurrent access of memory devices 512 that are in the same memory device groups. For example, first switch 542 can allow for access to first memory device 518 in the first group of memory devices 546 and second switch 544 can allow for access to second memory device 520 which is also in the first group of memory devices 546. Such is the case because the remaining of the memory devices in first group 546 overlap with memory devices in the second group 548. In another example, third switch 545 can allow for access to sixth memory device 527 in the third group of memory devices 550 and second switch 544 can allow for access to fifth memory device 525 which is also in the third group of memory devices 550. Such is the case because the remaining of the memory devices in third group 550 overlap with memory devices in the second group 548. This configuration allows for concurrent access of memory devices that are in the same memory device group even though each memory device 512 is not necessarily accessible by two or more data channels 514.

Although the subject matter has been described in language specific to structural features and/or methodological acts, it is to be understood that the subject matter in the appended claims is not necessarily limited to the specific features or acts described above. Rather, the specific features and acts are disclosed as example forms of implementing the claims.

What is claimed is:

1. A data storage system comprising:
a plurality of memory devices for storing data are classified into a plurality of different groups of memory devices, each memory device belongs to at least one of the groups of memory devices and at least some of the memory devices belong to more than one of the groups of memory devices;
a control circuit adapted to provide concurrent memory access operations to the plurality of memory devices;
a plurality of data channels, each data channel configured to provide a data path between the control circuit and one of the groups of memory devices; and
a plurality of switches configured to connect and disconnect a first memory device in a select one of the groups of memory devices to one of the plurality of data channels and concurrently connect and disconnect another of the memory devices in the select group of memory devices to a different one of the plurality of data channels.

2. The data storage system of claim 1, wherein the plurality of data channels comprise a first data channel that provides a data path between the control circuit and a first group of memory devices and a second data channel that provides a data path between the control circuit and a second group of memory devices.

3. The data storage system of claim 2, wherein the plurality of switches comprise a first switch that allows the first data channel to access a selected memory device in the first group of memory devices under a first memory access operation and a second switch that allows the second data channel to access a different selected memory device in the first group of memory devices under a second memory access operation.

4. The data storage system of claim 2, wherein the plurality of switches comprise a first switch that allows the first data channel to access a selected memory device in the second group of memory devices and a second switch that allows the second data channel to access a different selected memory device in the second group of memory devices under a second memory access operation.

5. The data storage system of claim 2, wherein the plurality of switches comprise a first switch that allows the first data channel to access a selected memory device in the second group of memory devices under a first memory access operation and a second switch that allows the second data channel to access a selected memory device in the first group of memory devices under a second memory access operation.

6. The data storage system of claim 1, wherein the plurality of switches connect and disconnect any one of the plurality of memory devices with any one of the plurality of data channels.

7. The data storage system of claim 1, wherein at least one memory device in each group of memory devices is classified into two different groups of memory devices.

8. The data storage system of claim 1, wherein each of the plurality of memory devices can be accessed by at least two of the plurality of data channels.

9. The data storage system of claim 1, wherein at least a portion of the plurality of memory devices can be accessed by at least two of the plurality of data channels.

10. A data storage system comprising:
a plurality of memory devices for storing data are classified into at least a first group of memory devices and a second group of memory devices, each memory device belongs to at least the first group or the second group of memory devices and at least some of the memory devices belong to both the first group and the second group of memory devices;
a control circuit adapted to concurrently transmit a first memory access operation and a second memory access operation;
a first data channel configured to provide a data path between the control circuit and the first group of memory devices;
a second data channel configured to provide a data path between the control circuit and the second group of memory devices;
a first switch allows the first data channel to access a selected memory device in the first group of memory devices under the first memory access operation; and
a second switch allows the second data channel to access a different selected memory device in the first group of memory devices under the second memory access operation.

11. The data storage system of claim 10, wherein the first group of memory devices and the second group of memory devices are part of a plurality of groups of memory devices, the first data channel and the second data channel are part of a plurality of data channels and the first switch and the second switch are part of a plurality of switches, wherein each data channel is configured to provide a data path between the control circuit and at least one of the groups of memory devices.

12. The data storage system of claim 11, wherein the plurality of switches can connect and disconnect any one of the plurality of memory devices with any one of the plurality of data channels.

13. The data storage system of claim 11, wherein at least one memory device in each group of memory devices is classified into two different groups of memory devices.

14. The data storage system of claim 11, wherein each of the plurality of memory devices can be accessed by at least two of the plurality of data channels.

15. The data storage system of claim 11, wherein at least a portion of the plurality of memory devices can be accessed by at least two of the plurality of data channels.

16. A method of performing at least two concurrent memory accessing operations, the method comprising:
obtaining a plurality of memory devices for storing data that are classified into at least a first group of memory devices and a second group of memory devices, each memory device belongs to at least one the first group or the second group of memory devices and at least some of the memory device belong to both the first group and the second group of memory devices;

obtaining a control circuit adapted to provide at least a first memory access operation to a first data channel and a second memory access operation to a second data channel concurrently;

dynamically connecting and disconnecting the first data channel to one of the memory devices in the first group of memory devices with a first switch; and dynamically connecting and disconnecting the second data channel to a different one of the memory devices in the first group of memory devices with a second switch.

17. The method of claim 16, wherein the first switch and the second switch can connect and disconnect any one of the memory devices in the first group and the second group with any one of the first and second data channels.

18. The data storage system of claim 16, wherein at least one memory device in each group of memory devices is classified into two different groups of memory devices.

19. The data storage system of claim 16, wherein each of the plurality of memory devices can be accessed by at least the first and second data channels.

20. The data storage system of claim 16, wherein at least a portion of the plurality of memory devices can be accessed by at least the first and second data channels.

* * * * *